(12) United States Patent
Hörling et al.

(10) Patent No.: US 7,056,602 B2
(45) Date of Patent: *Jun. 6, 2006

(54) PRECIPITATION HARDENED WEAR RESISTANT COATING

(75) Inventors: Anders Hörling, Linköping (SE); Lars Hultman, Linköping (SE); Jacob Sjölén, Fagersta (SE); Lennart Karlsson, Fagersta (SE)

(73) Assignee: Seco Tools AB, Fagersta (SE)

( * ) Notice: Subject to any disclaimer, the term of this patent is extended or adjusted under 35 U.S.C. 154(b) by 313 days.

This patent is subject to a terminal disclaimer.

(21) Appl. No.: 10/653,244

(22) Filed: Sep. 3, 2003

(65) Prior Publication Data

US 2004/0110039 A1 Jun. 10, 2004

(30) Foreign Application Priority Data

Sep. 4, 2002 (SE) ................................ 0202631

(51) Int. Cl.
*B32B 9/00* (2006.01)

(52) U.S. Cl. ..................... 428/697; 51/307; 51/309; 428/698; 428/699

(58) Field of Classification Search .............. 51/307, 51/309; 428/697, 698, 699

See application file for complete search history.

(56) References Cited

U.S. PATENT DOCUMENTS

| | | | |
|---|---|---|---|
| 5,272,014 A | 12/1993 | Leyendecker et al. | |
| 5,330,853 A | 7/1994 | Hofmann et al. | |
| 5,503,912 A | 4/1996 | Setoyama et al. | |
| 5,656,383 A * | 8/1997 | Tanaka et al. | 428/699 |
| 5,981,049 A | 11/1999 | Ohara et al. | |
| 6,077,596 A | 6/2000 | Hashimoto et al. | |

(Continued)

FOREIGN PATENT DOCUMENTS

| EP | 1201776 | * | 5/2002 |
|---|---|---|---|
| EP | 1 219 723 A2 | | 7/2002 |

(Continued)

OTHER PUBLICATIONS

Hermann A. Jehn et al., Morphology and Properties of Sputtered (Ti,Al)N Layers on High Speed Steel Substrates as a Function of Deposition Temperature and Sputtering Atmosphere, J. Vac. Sci. Technol. A 4 (6), 2701 (1986).

(Continued)

*Primary Examiner*—Archene Turner
(74) *Attorney, Agent, or Firm*—Drinker, Biddle & Reath LLP

(57) ABSTRACT

The present invention relates to a cutting tool insert having a substrate and a coating, the coating is composed of one or more layers of refractory compounds of which at least one layer includes a precipitation hardened $(Ti_yAl_xMe_{1-x-y})N$ based layer, where Me is one of the elements: Zr, Hf, V, Nb, Ta, Cr, Mo, W or Si, and:

- x is between 0.50 and 0.80;
- the ratio, $R=x/(x+y)$, is between 0.50 and 0.85;
- the sum of Ti and Al subscripts, $S=x+y$, is between 0.7 and 1.0;
- the ratio of the peak width, $F_{10/90}$, (FW10% M or FW90% M meaning Full Width at 10% and 90% of the maximum peak value reduced with the background) measured on the 200 peak at approximately 43°2θ (using Cu Kα radiation) of the $(Ti_yAl_xMe_{1-x-y})N$ coating, according to FIG. 4, is higher than 7.5;
- the ratio between the area of the h-AlN (100) peak at approximately 33°2θ $(=A(h\text{-}AlN)_{100})$ and the c-$(Ti_yAl_xMe_{1-x-y})N$ (200) peak at approximately 43°2θ $(=A(c\text{-}(Ti,Al,Me)N)_{200})$ called K, i.e. $K=A(h\text{-}AlN)_{100}/A(c\text{-}(Ti,Al,Me)N)_{200}$ K is between 0 and 0.3; and
- the layer a single $(Ti_yAl_xMe_{1-x-y})N$ (200) peak without several maxima.

11 Claims, 4 Drawing Sheets

U.S. PATENT DOCUMENTS

| | | | |
|---|---|---|---|
| 6,103,357 | A | 8/2000 | Selinder et al. |
| 6,254,984 | B1 | 7/2001 | Iyori |
| 6,309,738 | B1 | 10/2001 | Sakurai |
| 6,824,601 | B1 * | 11/2004 | Yamamoto et al. ......... 428/698 |
| 2002/0028323 | A1 | 3/2002 | Nakamura et al. |
| 2002/0081161 | A1 | 6/2002 | Yamada et al. |

FOREIGN PATENT DOCUMENTS

| | | |
|---|---|---|
| JP | 9295204 | 11/1997 |
| JP | 11-131216 | * 5/1999 |
| JP | 11310867 | 11/1999 |
| JP | 2001-234328 | * 8/2001 |

OTHER PUBLICATIONS

O. Knotek et al., On Structure and Properties of Sputtered Ti and Al Based Hard Compound Films, J. Vac. Sci. Technol. A 4 (6), 2695 (1986).

B.-J. Kim et al., High Temperature Oxidation of $(Ti_{1-x}Al_x)$N Coatings Made by Plasma Enhanced Chemical Vapor Deposition, J. Vac. Sci. Technol. A 17(1), 133 (1999).

W.-D. Münz, Titanium Aluminium Nitride Films—A New Alternative to Tin Coatings, Int. Conf. Met. Coat., San Diego, USA (1986).

Harland G. Tompkins, Oxidation of Titanium Nitride in Room Air and in Dry $O_2$, J. Appl. Phys. 70 (7), 3876 (1991).

D. McIntyre et al., Oxidation of Metastable Single-Phase Polycrystalline $Ti_{0.5}Al_{0.5}$N Films: Kinetics and Mechanisms, J. Appl. Phys. 67 (3), 1542 (1990).

H. Holleck, Metastable Coatings—Prediction of Composition and Structure, Surf. and Coat. Technol. 36, 151 (1988).

L. Karlsson et al., "Influence of residual stresses on the mechanical properties of $TiC_xN_{1-x}$ (x=0,0.15, 0.45) thin films desposited by arc evaporation", *Thin Solid Films*, 371 (2000) pp. 167-177.

S. Menzel et al., "Phase transitions in PACVD-(Ti,Al)N coatings after annealing", *Surface and Coatings Technology*, 124 (2000), pp. 190-195.

* cited by examiner

PRECIPITATION HARDENED WEAR RESISTANT COATING

This application claims priority under 35 U.S.C. §119 to 0202631-8 filed in Sweden on Sep. 4, 2002; the entire contents of which is hereby incorporated by reference.

FIELD OF THE INVENTION

The present invention relates to a wear resistant coating composed of one or more layers of a refractory-type compound. The present invention further relates to a cutting tool for machining by chip removal consisting of a substrate of cemented carbide, cermet, ceramics, cubic boron nitride based material or high speed steel and a hard and wear resistant refractory coating of which at least one layer comprises a precipitation hardened $(Ti_yAl_xMe_{1-x-y})N$ based layer, where Me is one of the elements Zr, Hf, V, Nb, Ta, Cr, Mo, W or Si.

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

Since the early 1980's, golden-coloured TiN-layers have been widely used for surface protective applications. In order to improve the oxidation resistance of these coatings, work began in the mid-1980's with adding aluminium to TiN [see e.g. H. A. Jehn, et al, J. Vac. Sci. Technol. A 4, 2701 (1986) and O. Knotek et.al, J. Vac. Sci. Technol. A 4, 2695 (1986)]. The compound thus formed, cubic-phase $Ti_{1-x}Al_xN$, was found to have superior oxidation resistance and enabled greater cutting speeds during machining, prolonged tool life, machining of harder materials, and improved manufacturing economy.

The mechanisms responsible for the excellent cutting performance of $Ti_{1-x}Al_xN$-coated tools have this far been associated with the coating's oxidation resistance. B.-J. Kim et.al., J. Vac. Sci. Technol. A 17(1), 133 (1999) reported that an increased aluminium content in the $Ti_{1-x}Al_xN$ compound improve the oxidation resistance. TiN oxidises rapidly at temperatures of 500–600° C. according to W.-D. Münz, invited paper Int. Conf. Met. Coat., San Diego, USA (1986) and H. G. Tompkins, J. Appl. Phys. 70, 3876 (1991), whereas oxidation of $Ti_{1-x}Al_xN$ starts at 750–900° C., [D. McIntyre et. al., J. Appl. Phys. 67, 1542 (1990)]. This give an increased upper operating temperature of $Ti_{1-x}Al_xN$ compared to TiN from 450–500° C. to 750–800° C. according to Münz et al. This concept of mainly $Ti_{1-x}Al_xN$ based materials, has been a subject for a large number of further optimization of different types, like macroscopically compositional gradients over the coated components as U.S. Pat. No. 5,272,014 disclose. Another way of optimization has been by applying different concepts of multilayer as; alternating Ti and Al containing layers (U.S. Pat. No. 6,309,738), oxygen and non-oxygen containing layers (U.S. Pat. No. 6,254,984), one of the layers stacked in the multilayer consist itself of a multilayer (U.S. Pat. No. 6,077,596), alternating nitrogen content (U.S. Pat. No. 5,330,853) or using one metastable compound (U.S. Pat. No. 5,503,912) or as an aperiodic multilayer (U.S. Pat. No. 6,103,357).

H. Holleck, Surf. Coat. Technol. 36, 151 (1988) have reported that the solid solubility of AlN in TiN is extremely low, and only at 2,700° K it reaches ~5 mol %. For larger AlN fractions, or at lower temperatures, the equilibrium system consists of cubic TiN and hexagonal AlN. However, as is well known, $Ti_{1-x}Al_xN$ can be deposited as a metastable cubic structure by using physical vapour deposition (PVD). At an elevated temperature during heat treatment or operation of a coated cutting tool, enough energy may then be supplied that phase separation into c-TiN and h-AlN occurs which normally deteriorates the wear resistance of the coating.

SUMMARY OF THE INVENTION

It is an object of the present invention to provide a coating comprising a precipitation hardened $(Ti_yAl_xMe_{1-x-y})N$ layer applied to a cutting tool for machining by chip removal.

It is a further object of the present invention to provide a method for depositing crystalline $(Ti_yAl_xMe_{1-x-y})N$ layers with low compressive residual stresses and hardened by precipitation of nano-crystalline secondary phase(s), using PVD-technique, this type of layer will hereafter be called PREHARD-TiAlN.

Surprisingly, we have now found that by balancing the chemical composition and the amount of thermal energy added, enhanced performance can be achieved by utilising initial phase separation of the $(Ti_yAl_xMe_{1-x-y})N$ layer into c-TiN, c-AlN and h-AlN solved in the $(Ti_aAl_bMe_{1-a-b})N$ matrix in a controlled manner, where a and b are not necessarily the same as x and y. This precipitation hardening effect will then balance the loss in hardness due to the annealing out of structural defects which normally contribute significantly to the hardness of wear resistant PVD-coatings based on nitrides and/or carbides, see, e.g.—Karlsson et al Thin Solid Films 371 (2000) 36.

According to one aspect, the present invention provides a cutting tool insert comprising a substrate and a coating wherein the coating comprises one or more layers of refractory compounds of which at least one layer comprises a precipitation hardened $(Ti_yAl_xMe_{1-x-y})N$ based layer, where Me is one of the element Zr, Hf, V, Nb, Ta, Cr, Mo, W or Si, and wherein: x is between 0.50 and 0.80; a ratio, $R=x/(x+y)$, is between 0.50 and 0.85; a sum of Ti and Al subscript, $S=x+y$, is between 0.7 and 1.0; a ratio of the peak width, $F_{10/90}$, FW10% M or FW90% M meaning Full Width at 10% and 90% of the maximum peak value reduced with the background, measured using X-ray diffraction with Cu Kα radiation of the 200 peak at approximately 43°2θ of the $(Ti_yAl_xMe_{1-x-y})N$ coating is higher than 7.5; a ratio between the area of the h-AlN (100) peak at approximately 33°2θ $(=A(h-AlN)_{100})$ and the $c-(Ti_yAl_xMe_{1-x-y})N$ (200) peak at approximately 43°2θ $(=A(c-(Ti,Al,Me)N)_{200})$ called K, i.e. $K=A(h-AlN)_{100}/A(c-(Ti,Al,Me)N)_{200}$ wherein K is between 0 and 0.3; and the layer has a single $(Ti_yAl_xMe_{1-x-y})N$ (200) peak.

DETAILED DESCRIPTION OF THE INVENTION

Figure 1:
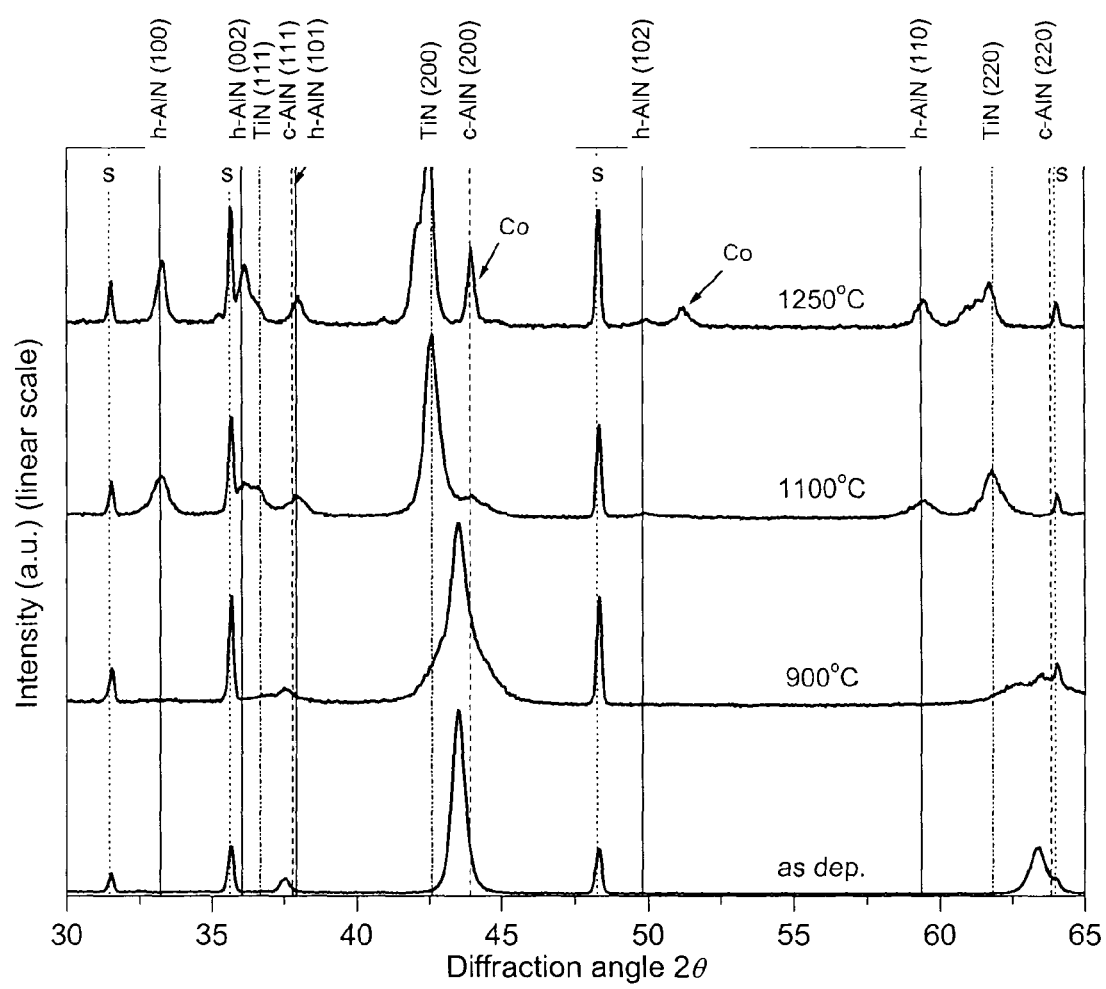
FIG. 1 illustrates X-ray diffraction patterns obtained from $(Ti_{0.34}Al_{0.66})(N_{0.97}O_{0.03})_{0.92}$ layers in as-deposited and annealed conditions.

According to the present invention there is provided a cutting tool for machining by chip removal comprising a body of a hard alloy of cemented carbide, cermet, ceramics, cubic boron nitride based material or high speed steel onto which a wear resistant coating is deposited composed of one or more layers of refractory compounds comprising at least one PREHARD-TiAlN layer(s). Additional layer(s) may be composed of metal nitrides and/or carbides and/or oxides with the metal elements chosen from Ti, Zr, Hf, V, Nb, Ta, Cr, Mo, W, Si and Al grown using physical vapour deposition (PVD) or other deposition technologies such as plasma enhanced chemical vapour deposition (PACVD) and/or chemical vapour deposition (CVD).

The PREHARD-TiAlN-layer(s) has a crystalline $(Ti_bAl_aMe_{1-a-b})N$ matrix hardened by precipitation of nanometer-sized cubic TiN (c-TiN), cubic AlN (c-AlN) and hexagonal AlN (h-AlN), crystallites, where a and b are not necessarily the same as x and y describing the overall composition as $(Ti_yAl_xMe_{1-x-y})N$ The layer has a low macroscopic compressive residual stress state between 0 and −3.5 GPa, preferably between 0 and −2 GPa. Me is one or several of the elements Zr, Hf, V, Nb, Ta, Cr, Mo, W and/or Si, preferably V, Zr, Ta and/or Nb, and most preferably Zr and/or Nb. If Me is V and/or Mo it is preferable that the PREHARD-TiAlN is not the outermost layer. If the PREHARD-TiAlN is the outermost layer, and Me is V and/or Mo, those elements should not be present in the very outermost part of the layer, since those metals forms low melting point and volatile oxides. This oxidation process will be detrimental for the properties of the PREHARD-TiAlN layer. Therefore the outer 30% of the PREHARD-TiAlN layer is preferably free of V and/or Mo when this layer is the outermost layer.

If Me is Ta, the compressive residual stress state of the as-deposited PREHARD-TiAlN layer will increase to very high values due to high momentum ion bombardment during growth of film surface. This high momentum is due to the high average charge state and the high atomic weight of Ta. In order to compensate for this, a second Me element should be added, preferably Cr, which due to good surface mobility, heals defects thereby reducing the compressive residual stress. Preferably the content (in atomic %) of Cr ($Me_{Cr}$) is 10–30% higher than the content of Ta ($Me_{Ta}$), i.e.: $1.10*Me_{Ta}<Me_{Cr}<1.30*Me_{Ta}$, and preferably $1.10*Me_{Ta}<Me_{Cr}<1.20*Me_{Ta}$.

In $(Ti_yAl_xMe_{1-x-y})N$, "x" is between 0.5 and 0.8, is preferably between 0.55 and 0.7. The ratio, $R=x/(x+y)$ is between 0.5 and 0.8 and preferably between 0.55 and 0.7. The sum of Ti and Al subscript, $S=x+y$, is preferably between 0.7 and 1.0, and most preferably between 0.8 and 1.0. In one preferred embodiment $x+y=1$ and in another embodiment $x+y<1$. The notation here used, $(Ti_yAl_xMe_{1-x-y})N$, imply stochiometry between metal atoms, i.e.—between $(Ti_yAl_xMe_{1-x-y})$ and N. However, perhaps a more accurate notation would be expressed as $(Ti_yAl_xMe_{1-x-y})N_j$ where j is between 1.2 and 0.8, preferably between 0.9 and 1.05. In further description, the simpler notation of $(Ti_yAl_xMe_{1-x-y})N$ will be used, except for example 1, where an exact measurement of the stoichiometry has been performed. In addition, coatings grown in industrial deposition system almost always contain a certain amount of oxygen (O) due to residual gases in the system, as demonstrated in example 1. Thus, it should be understood that, although not explicitly accounted for by the above-mentioned notation, oxygen may be present in the compound.

Figure 4:
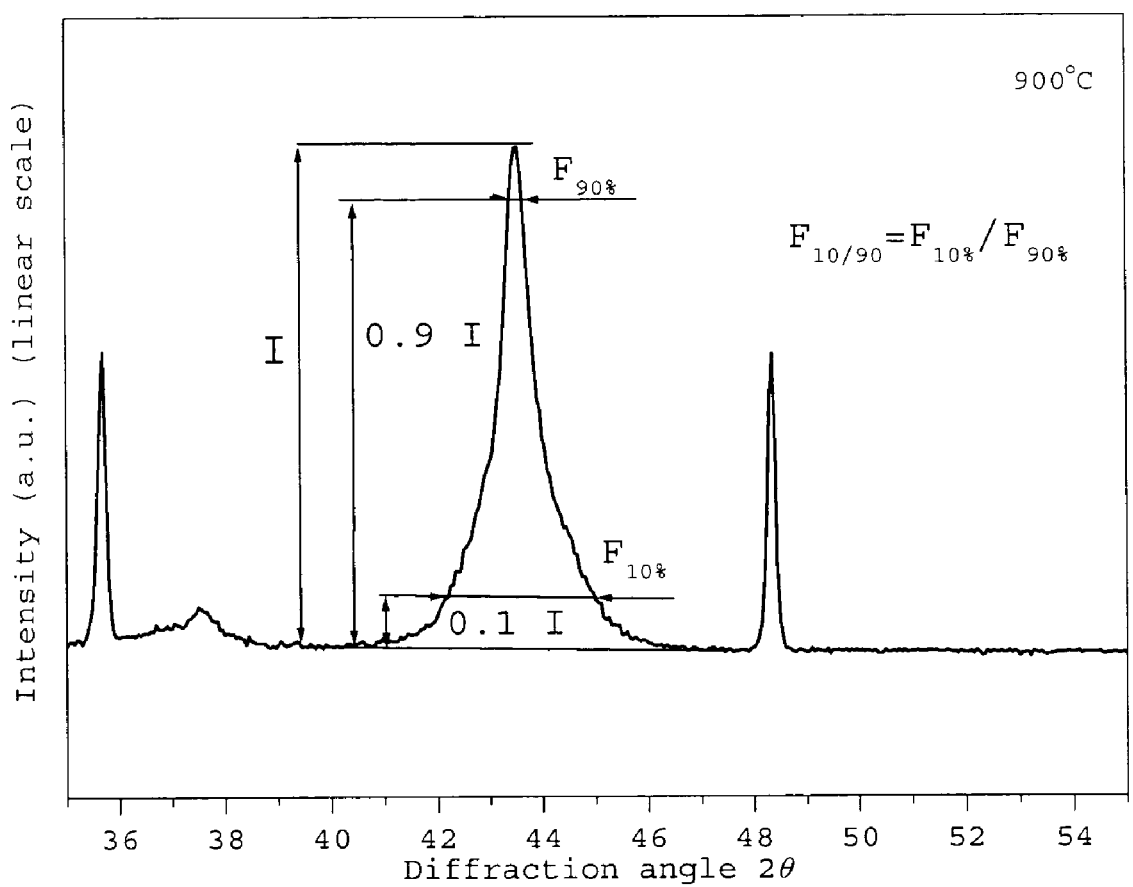
FIG. 4 is a schematic drawing showing the definition of the factor $F_{10/90}$.

The precipitation hardened $(Ti_yAl_xMe_{1-x-y})N$ layer has an enhanced hardness, toughness and thermal stability, due to a controlled transformation of the cubic (rocksalt structure) $(Ti_yAl_xMe_{1-x-y})N$ layer into hexagonal h-AlN, c-TiN and c-AlN in a matrix of $(Ti_aAl_bMe_{1-a-b})N$ where a and b not necessarily are the same as x and y. The layer is characterized by:

the ratio of the peak broadening, $F_{10/90}$, (FW10% M or FW90% M meaning Full Width at 10% and 90% of the maximum peak value which is reduced with the background (see FIG. 4)) measured on the 200 peak at approximately 43°2θ (using Cu Kα radiation) of the $(Ti_yAl_xMe_{1-x-y})N$ coating being >7.5, preferably >9.

the ratio (K) between the area of the h-AlN (100) peak at approximately 33°2θ $(=A(h-AlN)_{100})$ and the c-$(Ti_yAl_xMe_{1-x-y})N$ (200) peak at approximately 43°2θ $(=A(c-(Ti,Al,Me)N)_{200})$ called K, i.e. $K=A(h-AlN)_{100}/A(c-(Ti,Al,Me)N)_{200}$. K is preferably between 0 and 0.3 and most preferably between 0 and 0.2.

Figure 3:
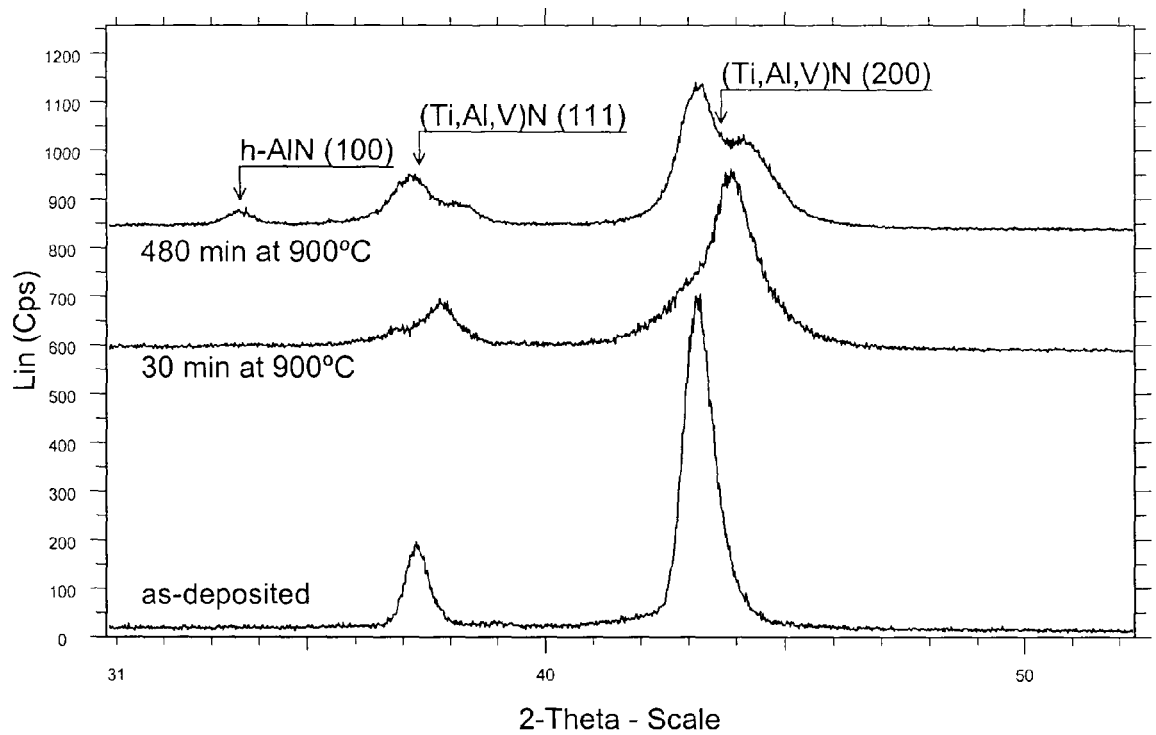
FIG. 3 illustrates X-ray diffraction patterns obtained from $(Ti0.38Al_{0.58}V_{0.04})N$ layers in as-deposited and annealed conditions.

PREHARD-TiAlN layer(s) include one single $(Ti_yAl_xMe_{1-x-y})N$ (200) peak without several maxima, e.g. as is the case of 480 min sample in FIG. 3. If several maxima occur originating from the same single layer, e.g. two, three or more peaks, this is an indication that a transformation process has proceeded too far. The structure obtained when several peaks occur is to coarse due to large precipitates and should not be considered as the precipitation hardened structure denoted herein as PREHARD-TiAlN according to the present invention.

The PREHARD-TiAlN layer(s) can also be deposited directly onto a cutting tool substrate. The thickness of the PREHARD-TiAlN layer(s) varies between 0.5 and 12 μm, preferably between 0.5 and 8 μm, especially for machining by chip removal. The total coating thickness, if the PREHARD-TiAlN layer(s) according to the present invention is combined with other layer(s), varies between 0.5 and 15 μm, preferably between 1 and 12 μm with the thickness of the non-PREHARD-TiAlN-layer(s) varying between 0.5 and 8 μm.

In an alternative embodiment, the PREHARD-TiAlN-layer(s) of 0.5 and 10 μm, with or without other layer(s) as described above. An outer 0.5 to 5 μm thick layer of a solid low friction material based on $MoS_2$ or a MeC/C, where Me is Cr, W, Ti or Ta, can be deposited on top of the coating.

In another alternative embodiment the PREHARD-TiAlN layer(s) between 0.1 and 2 μm are one of 1 to 5 different materials in a 1.0 to 15 μm thick multi-layer coating composed of 2–500, preferably 5–200, individual layers.

In yet another alternative embodiment the PREHARD-TiAlN-layer(s) of 0.5 and 20 μm thickness can be deposited on top of a CVD coating which may comprise one or several layer(s) of a crystalline $Al_2O_3$.

The method used to grow the coatings comprising a PREHARD-TiAlN-layer(s) of the present invention are based on arc evaporation of an alloy or composite cathode under the following conditions:

The Ti/Al-cathode composition is between (50 at % Ti+50 at % Al) and (20 at % Ti+80 at % Al), preferably between (40 at % Ti+60 at % Al) and (30 at % Ti+70 at % Al).

Evaporation current is between 50 A and 200 A depending on cathode size. Using cathodes of 63 mm in diameter, the current is preferably between 50 A and 80 A.

Ar/N$_2$ atmosphere of 0–50 vol % Ar, preferably 0–20 vol %, at total pressure of 1.0 Pa to 9.0 Pa, preferably 1.5 Pa to 5.0 Pa.

Substrate bias of −10 V to −300 V, preferably −40 V to −120.

Deposition temperature shall be between 400° C. and 700° C., preferably 500° C. and 650° C.

To grow a (Ti$_y$Al$_x$Me$_{1-x-y}$)N, where Me is one or several of the elements Zr, Hf, V, Nb, Ta, Cr, Mo, W or Si, alloyed cathodes are used. An alternative is to use one/several pure Me cathode(s) and to position this/these cathodes at a longer distance from the substrates than the Ti/Al cathodes are positioned. In this way the preferable alloying of the (Ti,Al)N layer can also be made.

If pure V or Zr cathode(s) is/are used, the evaporation current is preferably between 60 A and 90 A. For Nb and Ta the current can be between 80 A and 100 A. Those current values are suitable for cathodes of 63 mm in diameter but will be different for other cathode sizes.

Since the (Ti$_y$Al$_x$Me$_{1-x-y}$)N-phase also forms metal carbonitride or carbonitrideoxide compounds, and by using PVD-technique to grow the PREHARD-TiAlN-layer, carbon and/or oxygen containing gas can be added to the atmosphere during deposition (e.g. C$_2$H$_2$ or CH$_4$, CO, O$_2$), so that carbon/oxygen alloyed PREHARD-TiAlN can be obtained (e.g. (Ti$_y$Al$_x$Me$_{1-x-y}$)N$_{1-d-e}$C$_d$O$_e$ where d+e is between 0 and 0.2).

Annealing is preferably performed in an inert atmosphere of Ar and/or N$_2$ at a temperature between 800° C. and 1100° C. over a period of 5 to 240 min. However, the optimal temperature and period is given by the initial phase separation as can be seen by XRD analysis. The annealing can also be performed in-situ in the deposition system, if the system can generate enough thermal energy to obtain the preferred initial phase separation. One possibility to obtain the initial phase separation is to deposit a CVD coating, at a deposition temperature of 800° C. to 1050° C., on top of the as-deposited composite-TiAlN layer.

The present invention has been described with reference to layer(s) of a PREHARD-TiAlN deposited using arc evaporation. PREHARD-TiAlN-layer(s) also could be produced using other PVD-technologies such as magnetron sputtering, electron beam evaporation, ion plating or laser ablation.

EXAMPLE 1

Cemented carbide substrates with composition 93.5 wt % WC, 6 wt % Co, and 0.5 wt % (Ta,Nb)C were used. The WC grain size was about 1 μm and the hardness was 1630 HV$_{10}$. The substrates were ground on diamond disks and polished using fine-grained diamond slurry in order to obtain a mirror like surface for the material analysis.

Before deposition, the substrates were cleaned in ultrasonic baths of an alkali solution and alcohol. The shortest cathode-to-substrate distance was 160 mm. The system was evacuated to a pressure of less than 2.0×10$^{-3}$ Pa, after which the substrates were sputter cleaned with Ar ions. The (Ti,Al)N layer was grown using arc evaporation of six Ti/Al (33 at % Ti+67 at % Al) cathodes (63 mm in diameter) in an 99.995% pure N$_2$ atmosphere at a total pressure of 2.0 Pa, using a substrate bias of −90 V. The deposition was carried out during 60 min in order to obtain a coating thickness of approximately 3 μm. The deposition temperature was ~530° C. Immediately after deposition the chamber was vented with dry N$_2$.

Isothermal post annealing of the coated inserts was carried out at various temperatures in a hot-wall quartz-tube furnace with a 0.40 m long constant temperature (±5° C.) zone. The inserts were inserted into the furnace, which was already heated to and stabilised at the desired temperature. The annealing experiments were performed in flowing Ar at atmospheric pressure for a period of 120 min.

A separate layer, thickness 300 nm, intended for chemical characterisation was deposited onto a pure C substrate using identical process parameters. The chemical analysis was performed by Rutherford backscattering spectrometry (RBS), using 4He$^{3O}$ ions of 1.8 MeV kinetic energy and a scattering angle of 170°. The RUMP software was used for evaluating raw data. The obtained composition of the as-deposited layer was (Ti$_{0.34}$Al$_{0.66}$)(N$_{0.970}$O$_{0.03}$)$_{0.92}$.

The XRD (X-ray diffraction) pattern(s), produced using Cu Kα radiation and a configuration with a constant grazing incidence angle of 2° of the as-deposited and annealed (Ti$_{0.34}$Al$_{0.66}$)(N$_{0.97}$O$_{0.03}$)$_{0.92}$ layers are shown in FIG. 1. The as-deposited layer consists of a single-phase [NaCl] structure. The (200) peak was positioned at 43.5°2θ. For annealing at 600° C. the F$_{10/90}$ value remained constant. For annealing temperatures from 600° C. to 900° C. the F$_{10/90}$ value increased from 6 to 10. It can clearly be seen in FIG. 1 that annealing at 900° C. resulted in a broadening of the base of the peak and a sharpening at the top. This is the change in symmetry, which is reflected by an increased F$_{10/90}$ value Annealing at 1100° C. made the c-(T$_{0.34}$Al$_{0.66}$)(N$_{0.97}$O$_{0.03}$)$_{0.92}$ (200) peak position shift towards lower 2θ values, coming very close to the position for the unstrained TiN (200) peak. Peaks originating from h-AlN were also found to appear after annealing at 1100° C. Annealing at 1250° C. resulted in a strong peak from Co (111) at 44°2θ as a result of Co migration up onto the coating surface during this high temperature annealing. The F$_{10/90}$ values of the layers annealed at 1100° C. and 1250° C. are close to the values of the as-deposited layer.

The macroscopic residual stress state of the layers was determined by using a substrate curvature technique described by Ramsey et al. Surf. Coat. Technol. 43–44, 223 (1990) and Stoney Proc. R. Soc. London A 82, 172 (1909). The coated WC—Co platelets, 5×5×0.8 mm$^3$, were prepared by cutting, grinding and polishing to a final thickness between 200–300 μm. The macroscopic residual stress of the layers were compressive and largest in the as-deposited at −2.3±0.5 GPa (assuming E$_{WC-6wt \% Co}$=600 GPa, υv$_{WC-Co}$=0.22). Annealing at 900° C. for 120 min resulted in stress relaxation to −1.2 GPa, see Table 2.

Figure 2A:
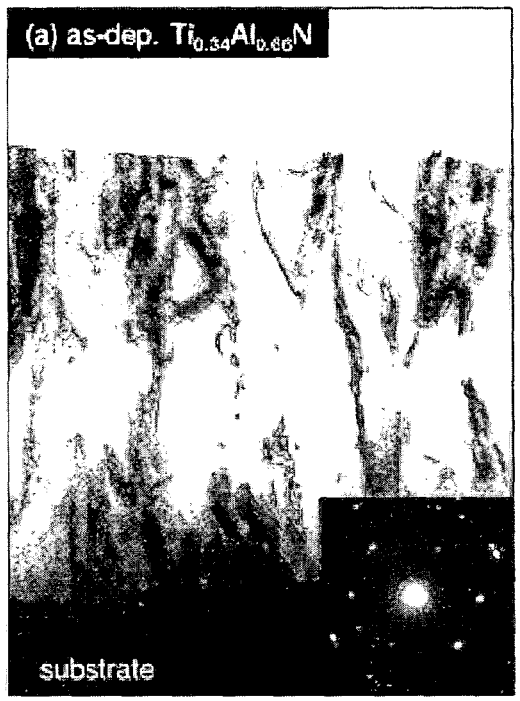
FIG. 2 is a TEM micrograph of $(Ti_{0.34}Al_{0.66})(N_{0.97}O_{0.03})_{0.92}$ layers in (a) as-deposited, (b) 120 min at 900° C. (c) 120 min at 1100° C.-annealed conditions.
Figure 2B:
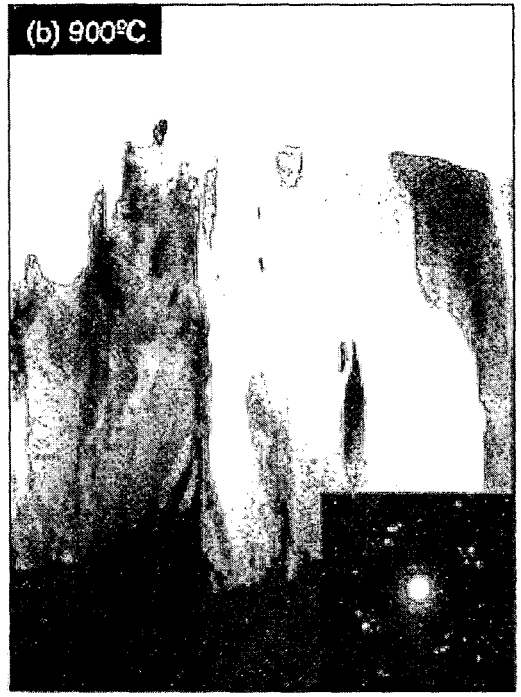
Figure 2C:

Cross-sectional transmission electron microscope (TEM) imagery was used to study the microstructure of the coatings. The sample preparation consisted of mechanical grinding and polishing followed by ion-beam sputter etching on both upper and lower surfaces. Cross-sectional TEM micrographs of the as-deposited (Ti$_{0.34}$Al$_{0.66}$)(N$_{0.97}$O$_{0.03}$)$_{0.92}$ layers (FIG. 2a) revealed a dense and columnar microstructure with a high defect density and overlapping strain fields due to residual stresses. With respect to the initialised phase separation at 900° C. observed by XRD, the micrographs of the annealed sample revealed a structure similar to the as-deposited condition, except for column boundaries appearing more clearly defined. Annealing at 1100° C. resulted in phase separation of the metastable c-(Ti,Al)N structure into h-AlN precipitates in a c-(Ti,Al)N matrix, as evidenced by the selected-area electron diffraction (SAED) patterns. Original column boundaries were also dissolved at this temperature, and a fine-textured structure consisting of sub-grains of diameter 50–100 nm evolved. The texture was of a feather-like type with the subgrains spreading out in the growth direction in bundles limited by the parent grain; the parent grain being defined by original column boundaries in the 900° C.-annealed condition. From a comparison of SAED patterns in FIGS. 2b and 2c, it appears that each sub-grain has inherited the initial orientation of the respective parent grain, however, within a few degrees of misorientation. Higher-magnification electron micrographs of this structure (inset FIG. 2c) reveal nanometer-sized grains of both cubic and hexagonal structure. After annealing at 1250° C., grains of both hexagonal and cubic phase were found to coarsen and become evenly distributed throughout the entire layer thickness. In addition, the grains adopted an equiaxed geometry with average diameter ~50 nm.

Scratch testing resulted in a critical load, $F_{N,C}$, of the as-deposited layer of ~60 N. After annealing an enhanced adhesion of variant B to E could be detected with a maximum $F_{N,C}$ of ~80 N of variant E. For higher annealing temperature decreased $F_{N,C}$. Very low $F_{N,C}$ (~20N) were seen for variant G annealed at 1250° C. See Table 2.

TABLE 1

| Variant | Annealing Temp. [° C.] | K (h-100)/(c-200) | Shape c-(200) | $F_{10/90}$ |
|---|---|---|---|---|
| A | As-dep. | 0 | One peak | 6.4 |
| B | 600 | 0 | One peak | 6.3 |
| C | 700 | 0 | One peak | 7.4 |
| D | 800 | 0 | One peak | 8.3 |
| E | 900 | 0 | One peak | 10.0 |
| F | 1100 | 0.22 | One peak | 6.1 |
| G | 1250 | 0.17 | Multiple | 6.3 |

TABLE 2

| Variant | Critical load $F_{NC}$ [N] | Macro Residual stress $\sigma^M$ [GPa] | Hardness. H [GPa] | Coating morphology |
|---|---|---|---|---|
| A | 60 | -2.3 ± 0.5 | 33.9 | Columnar |
| B | 60 | — | 33.8 | Columnar |
| C | 70 | — | 35.6 | Columnar |
| D | 70 | — | 31.1 | Columnar |
| E | 80 | -1.2 ± 0.1 | 35.8 | Columnar |
| F | 50 | — | 30.6 | Nanocrystalline |
| G | 20 | — | 28.4 | Equiaxed |

EXAMPLE 2

Similar substrates as in example 1 were coated with a single layer of $(Ti_yAl_xMe_{1-x-y})N$ where Me is V. The substrates were positioned on a fixture of drum type on a position just in front of one Ti/Al cathode (33 at % Ti+67 at % Al). One V-cathode (99.9 at %) was offset in height from the substrates by 20 cm. The composition of the layer analyzed with Energy Dispersive Spectroscopy (EDS) gave a notation of $(Ti_{0.36}Al_{0.58}V_{0.06})N$, the ratio between metal atoms and nitrogen could not be measured using this technique, but it is assumed in the notation to be stoichiometric, (i.e.—one). This composition gives a ratio $R=x/(x+y)=0.62$ and $S=x+y=0.94$. The coating thickness was 4 μm. The as-deposited samples were isothermally post-annealed at 900° C. in an Ar atmosphere at atmospheric pressure for different periods ranging from 0 (=as-deposited) to 480 min. The samples were analysed by XRD using constant grazing incident geometry of 2°2θ using Cu Kα radiation.

The as-deposited layer consisted of single-phase [NaCl] structure, see FIG. 3. After the longest periods of annealing at 900° C., the h-AlN (100) peak could not be detected, i.e. the ratio K is equal to zero for all layers. However, for the longest periods of annealing the c-$(Ti_{0.36}Al_{0.58}V_{0.06})N$ (200) peak separated into two peaks of different lattice parameter.

The change of the $(Ti_{0.36}Al_{0.58}V_{0.06})N$ (200) peak shape was studied expressed as the ratio $F_{10/90}$. Also in this material system can it be seen that the $F_{10/90}$ value has a maximum after a period of annealing, see Table 3.

TABLE 3

| Variant | Period of annealing | K (h-100)/(c-200) | Shape c-(200) | $F_{10/90}$ |
|---|---|---|---|---|
| H | As-dep. | 0 | One peak | 7.1 |
| I | 10 | 0 | One peak | 11.2 |
| J | 30 | 0 | One peak | 18.2 |
| K | 60 | 0.01 | One peak | 14.1 |
| L | 120 | 0.02 | One peak | 6.5 |
| M | 240 | 0.02 | One peak | 6.8 |
| N | 480 | 0.03 | Two peaks | 8.7 |

EXAMPLE 3

Cemented carbide cutting tool inserts with composition 93.5 wt % WC, 6 wt % Co, and 0.5 wt % (Ta,Nb)C, were coated and annealed according to example 1 (the same names of the variants are used).

Face milling tests with homogeneous and interrupted cut were performed in SS2541 or AISI 304. The homogeneous test was made in an 60 mm wide plate and the interrupted by using three 20 mm wide plates separated by 10 mm, mounted as a package. The cutting data were; $v_c$=250 m/min (homogeneous) and 200 m/min (interrupted), f=0.1 mm/rev and depth of cut=2.5 mm.

| Variant | Homogeneous cut Tool life, mm | Interrupted cut Tool life, mm | $F_{10/90}$ |
|---|---|---|---|
| A | 3300 | 2200 | 6.4 |
| B | 2900 | 2600 | 6.3 |
| C | 3100 | 2550 | 7.4 |
| D | 2950 | 3050 | 8.3 |
| E | 2700 | 3400 | 10.0 |
| F | 2100 | 2700 | 6.1 |
| G | 950 | 600 | 6.3 |

This test demonstrates that the variant E has the best toughness without a large drop in tool life during in homogeneous cutting. Variant E has also the highest $F_{10/90}$ value.

EXAMPLE 4

Cemented carbide cutting tool inserts with composition 93.5 wt % WC, 6 wt % Co, 0.5 wt % (Ta,Nb)C, were coated and annealed according to example 2 (the same name of the variants are used).

Face milling tests with interrupted cut were performed in SS2541 according to example 3.

| Variant | Interrupted cut Tool life, mm | $F_{10/90}$ |
|---|---|---|
| H | 2050 | 7.1 |
| I | 2400 | 11.2 |

-continued

| Variant | Interrupted cut Tool life, mm | $F_{10/90}$ |
|---|---|---|
| J | 2900 | 18.2 |
| K | 3100 | 14.1 |
| L | 2700 | 6.5 |
| M | Failure | 6.8 |
| N | 1650 | 8.7 |

This test demonstrates that the variant J-K has the best wear resistance in interrupted cut. Those variants have also the highest $F_{10/90}$ value. Variant M got large chippage already after 600 mm into the cut. Note that variant N, with a high $F_{10/90}$ value but with two maxima of the 220-peak, does not work very well. This demonstrates the importance that the precipitation process needs to be properly adjusted, as present invention demonstrates.

EXAMPLE 5

Some of the variants from example 1 were tested in a square shoulder-milling test in stainless steel using following cutting data:
Insert: SONX 120405TR-M12, WC-10 wt % Co
Material: SS2333
$V_c$=250 m/min
$f_z$=0.2 mm
$a_p$=2.5 mm, $a_e$=25 mm
Cutter diameter 125 mm

| Variant | Tool life, mm | $F_{10/90}$ |
|---|---|---|
| A | 2700 | 6.4 |
| E | 3600 | 10.1 |
| F | 1900 | 6.1 |
| G | 600 | 6.3 |

This test demonstrates that the variant E has the best toughness. Variant A was worn out due to chippage at the depth of cut.

EXAMPLE 6

A variant grown using same deposition data as variant A but thinner, 1 μm, was annealed for different periods at 900° C. and tested in interrupted cut according to example 2.

| Variant | Annealing Period at 900° C. [min] | K (h-100)/(c-200) | Shape c-(200) | $F_{10/90}$ | Interrupted cut Tool life [mm] |
|---|---|---|---|---|---|
| O | 0 | 0 | One peak | 7.19 | 1100 |
| P | 15 | 0 | One peak | 10.06 | 1650 |
| Q | 30 | 0 | One peak | 12.46 | 1900 |
| R | 60 | 0 | One peak | 8.85 | 1400 |
| S | 120 | 0 | One peak | 7.23 | 1500 |
| T | 240 | 0 | Two peaks | 12.53 | 1200 |
| U | 480 | 0 | Two peaks | 10.73 | 1350 |

This test demonstrates the enhanced toughness and tool life follows the $F_{10/90}$ value.

The described embodiments of the present invention are intended to be illustrative rather than restrictive, and are not intended to represent every possible embodiment of the present invention. Various modifications can be made to the disclosed embodiments without departing from the spirit or scope of the invention as set forth in the following claims, both literally and in equivalents recognized in law.

We claim:

1. A cutting tool insert comprising a substrate and a coating wherein the coating comprises one or more layers of refractory compounds of which at least one layer comprises a precipitation hardened $(Ti_yAl_xMe_{1-x-y})N$ based layer, where Me is one of the elements Zr, Hf, V, Nb, Ta, Cr, Mo, W or Si, and wherein:
   x is between 0.55 and 0.80;
   a ratio, R=x/(x+y), is between 0.50 and 0.85;
   a sum of Ti and Al subscripts, S=x+y, is between 0.7 and less than 1.0;
   a ratio of the peak width, $F_{10/90}$, FW10% M or FW90% M meaning Full Width at 10% and 90% of the maximum peak value reduced with the background, measured using X-ray diffraction with Cu Kα radiation of the 200 peak at approximately 43°2θ of the $(Ti_yAl_xMe_{1-x-y})N$ coating is higher than 7.5;
   a ratio between the area of the h-AlN (100) peak at approximately 33°2θ (=A(h-AlN)$_{100}$) and the c-$(Ti_yAl_xMe_{1-x-y})N$ (200) peak at approximately 43°2θ (=A(c-(Ti,Al,Me)N)$_{200}$) called K, wherein K=A(h-AlN)$_{100}$/A(c-(Ti,Al,Me)N)$_{200}$, and K is between 0 and 0.3; and
   the layer has a single $(Ti_yAl_xMe_{1-x-y})N$ (200) peak.

2. The cutting tool insert according to claim 1 wherein:
   x is between 0.55 and 0.70;
   the ratio, R=x/(x+y), is between 0.55 and 0.75;
   the sum of Ti and Al subscripts, S=x+y, is between 0.8 and less than 1.0; and
   the $F_{10/90}$ value is higher than 8.

3. The cutting tool insert according to claim 2, wherein:
   x is between 0.60 and 0.70;
   the ratio, R=x/(x+y), is between 0.60 and 0.75;
   the $F_{10/90}$ value is higher than 9; and
   K is between 0 and 0.2.

4. The cutting tool insert according to claim 1, wherein Me=V, Zr, Ta, Nb, Si, or Cr.

5. The cutting tool insert according to claim 1, wherein the layer is deposited by PVD and the precipitates are obtained by a spinodal decomposition of the cubic $(Ti_yAl_xMe_{1-x-y})N$ layer.

6. The cutting tool insert according to claim 1, wherein the precipitates comprise nano-meter sized cubic TiN (c-TiN) and cubic AlN (c-AlN) and/or hexagonal AlN (h-AlN).

7. A cutting tool insert comprising a substrate and a coating wherein the coating comprises one or more layers of refractory compounds of which at least one layer comprises a precipitation hardened $(Ti_yAl_xMe_{1-x-y})N$ based layer, where Me is one of the elements Zr or Nb, and wherein:

x is between 0.55 and 0.80;

a ratio, $R=x/(x+y)$, is between 0.50 and 0.85 a sum of Ti and Al subscripts, $S=x+y$, is between 0.7 and less than 1.0;

a ratio of the peak width, $F_{10/90}$, FW10% M or FW90% M meaning Full Width at 10% and 90% of the maximum peak value reduced with the background, measured using X-ray diffraction with Cu Kα radiation of the 200 peak at approximately 43°2θ of the $(Ti_yAl_xMe_{1-x-y})N$ coating is higher than 7.5;

a ratio between the area of the h-AlN (100) peak at approximately 33°2θ $(=A(h-AlN)_{100})$ and the c-$(Ti_yAl_xMe_{1-x-y})N$ (200) peak at approximately 43°2θ $(=A(c-(Ti,Al,Me)N)_{200})$ called K, wherein $K=A(h-AlN)_{100}/A(c-(Ti,Al,Me)N)_{200}$, and K is between 0 and 0.3; and the layer has a single $(Ti_yAl_xMe_{1-x-y})N$ (200) peak.

8. The cutting tool insert according to claim 7, wherein:

x is between 0.55 and 0.70;

the ratio, $R=x/(x+y)$, is between 0.55 and 0.75;

the sum of Ti and Al subscripts, $S=x+y$, is between 0.8 and less than 1.0; and the $F_{10/90}$ value is higher than 8.

9. The cutting tool insert according to claim 8, wherein:

x is between 0.60 and 0.70;

the ratio, $R=x/(x+y)$, is between 0.60 and 0.75;

the $F_{10/90}$ value is higher than 9; and

K is between 0 and 0.2.

10. The cutting tool insert according to claim 7, wherein the layer is deposited by PVD and the precipitates are obtained by a spinodal decomposition of the cubic $(Ti_yAl_xMe_{1-x-y})N$ layer.

11. The cutting tool insert according to claim 7, wherein the precipitates comprise nano-meter sized cubic TiN (c-TiN) and cubic AlN (c-AlN) and/or hexagonal AlN (h-AlN).

* * * * *